(12) United States Patent
Zhou

(10) Patent No.: US 6,787,122 B2
(45) Date of Patent: Sep. 7, 2004

(54) METHOD OF MAKING NANOTUBE-BASED MATERIAL WITH ENHANCED ELECTRON FIELD EMISSION PROPERTIES

(75) Inventor: Otto Z. Zhou, Chapel Hill, NC (US)

(73) Assignee: The University of North Carolina at Chapel Hill, Chapel Hill, NC (US)

( * ) Notice: Subject to any disclaimer, the term of this patent is extended or adjusted under 35 U.S.C. 154(b) by 12 days.

(21) Appl. No.: 09/881,684

(22) Filed: Jun. 18, 2001

(65) Prior Publication Data
US 2002/0193040 A1 Dec. 19, 2002

(51) Int. Cl.$^7$ ................................................. D01F 9/12
(52) U.S. Cl. .............................. 423/447.1; 423/445 B; 423/445 R
(58) Field of Search ................ 423/445 R, 445 B, 423/447.3, 447.1, 447.2

(56) References Cited

U.S. PATENT DOCUMENTS

| | | | | |
|---|---|---|---|---|
| 5,457,343 A | * | 10/1995 | Ajayan et al. | 257/734 |
| 5,641,466 A | * | 6/1997 | Ebbesen et al. | 423/445 B |
| 5,698,175 A | * | 12/1997 | Hiura et al. | 423/445 B |
| 5,951,832 A | * | 9/1999 | Tanaka et al. | 204/157.47 |
| 5,977,697 A | * | 11/1999 | Jin et al. | 313/310 |
| 6,057,637 A | * | 5/2000 | Zettl et al. | 313/310 |
| 6,090,363 A | * | 7/2000 | Green et al. | 423/445 B |
| 6,099,965 A | | 8/2000 | Tennent et al. | |
| 6,129,901 A | * | 10/2000 | Moskovits et al. | 423/439 |
| 6,217,843 B1 | * | 4/2001 | Homyonfer et al. | 252/501.1 |
| 6,280,697 B1 | | 8/2001 | Zhou et al. | |
| 6,283,812 B1 | * | 9/2001 | Jin et al. | 445/24 |
| 6,383,923 B1 | * | 5/2002 | Brown et al. | 438/666 |
| 6,413,487 B1 | * | 7/2002 | Resasco et al. | 423/447.3 |
| 6,417,606 B1 | * | 7/2002 | Nakamoto et al. | 313/336 |
| 6,426,134 B1 | * | 7/2002 | Lavin et al. | 428/300.1 |
| 6,456,691 B2 | | 9/2002 | Takahashi et al. | |
| 2002/0110996 A1 | | 8/2002 | Yaniv et al. | |

FOREIGN PATENT DOCUMENTS

| | | |
|---|---|---|
| EP | 1 092 680 A1 | 4/2001 |
| WO | 98/39250 A1 | 9/1998 |

OTHER PUBLICATIONS

Liu et al. "Fullerene Pipes", May 22, 1998, Science vol. 280, pp. 1253–1255.*
Gao et al. "Electrochemical intercalation of single-walled carbon nanotubes with lithium", Jul. 2, 1999, Chemical Physics Leters 307, pp. 153–157.*
Lee et al. "Conductivity enhancement in single-walled carbon nanotube bundles doped with K and Br", Jul. 17, 1997, Nature vol. 388, pp. 255–256.*
Satishkumar et al. "Novel experiments with carbon nanotubes: opening, filling, closing, and functionalizing nanotubes" Journal of Physics B, vol. 29, 1996, pp. 4925–4934.*
Suzuki et al., "Work Functions and Valence Band States of Pristine and Cs-intercalucalted Single-Walked Carbon Nanotube Bundles", Appl. Phys. Lett., vol. 76, No. 26, pp 407–409, Jun. 26, 2000.
Wadhawan, A., et al., "Effects of Cs Deposition in the Field–Emission Properties of Single–Walled Carbon Nanotube Bundles", Appl. Phys. Lett., vol. 78, No. 1, pp 108–110, Jan. 1, 2001.

(List continued on next page.)

*Primary Examiner*—Stuart L. Hendrickson
*Assistant Examiner*—Peter J Lish
(74) *Attorney, Agent, or Firm*—Burns, Doane, Swecker, & Mathis, L.L.P.

(57) ABSTRACT

A method of reducing electronic work function, reducing threshold field emission values, converting semiconducting behavior to metallic behavior, increasing the electron density state at the Fermi level, and increasing electron emission site density, of nanostructure or nanotube-containing material, the method including: forming openings in the nanotube-containing material; introducing a foreign species such as an alkali metal into at least some of the openings; and closing the openings, thereby forming capsules filled with the foreign species, and forming field emission cathode and flat panel displays using these capsules.

54 Claims, 5 Drawing Sheets

OTHER PUBLICATIONS

Bower, C., et al., "Plasma Inducted Conformal Alignment of Carbon Nanotubes on Curves Surfaces", Appl. Phys. Lett., vol. 77, No. 6, pp 830–832, Aug. 7, 2000.

Journet, C., et al., Nature, vol. 388, p. 756 (1977).

USSN 09/296,572, Bower et al., "Device Comprising Carbon Nanotube Field Emitter Structure and Process for Forming Device", Apr. 22, 1999.

USSN 09/351,537, Bower et al., "Device Comprising Thin Film Carbon Nanotube Electron Field Emitter Structure", Jul. 1, 1999.

USSN 09/376,457, Bower et al., "Method for Fabrication of Patterned Carbon Nanotube Films", Aug. 18, 1999.

USSN 09/594,844, Zhou et al., "Nanostructure–Based High Energy Capacity Material", Jun. 15, 2000.

USSN 09/679,303, Zhou et al., "X–Ray Generating Mechanism Using Electron Field Emission Cathode", Oct. 6, 2000.

USSN 09/817,164, Stoner et al. "Coated Electrode with Enhanced Electron Emission and Ignition Characteristics", Mar. 27, 2001.

R. S. Lee et al., "Conductivity Enhancement in Single–Walled Carbon Nanotube Bundles Doped with K and Br", *Nature*, vol. 388, Jul. 17, 1997, pp. 255–257, Macmillan Publishers Ltd.

B. Gao et al., "Electrochemical Intercalation of Single–Walled Carbon Nanotubes with Lithium", *Chem. Phys. Lett.*, 307 (1999), pp. 153–157.

J. Liu et al., "Fullerene Pipes", *Science*, vol. 28, May 22, 1998, pp. 1253–1256.

W. Zhu et al., "Large Current Density from Carbon Nanotube Field Emitters", *Appl. Phys. Lett.*, vol. 75, No. 6, Aug. 9, 1999, American Institute of Physics.

Q. H. Wang et al., "Field Emission from Nanotube Bundle Emitters at Low Fields", *Appl. Phys. Lett.*, vol. 70, No. 24, Jun. 16, 1997, pp. 3308–3310 American Institute of Physics.

* cited by examiner

METHOD OF MAKING NANOTUBE-BASED MATERIAL WITH ENHANCED ELECTRON FIELD EMISSION PROPERTIES

STATEMENT REGRADING FEDERALLY SPONSORED RESEARCH OR DEVELOPMENT

At least some aspects of this invention were made with Government support under contract no. N00014-98-1-05907. The Government may have certain rights in this invention.

FIELD OF THE INVENTION

The present invention relates to a method of improving certain properties of nanotube and nanoparticles-based materials. For example, the present invention relates to a method of intercalating a nanostructure or nanotube-containing material with a foreign species thereby causing the material to exhibit one or more of the following: reduction of the work function; reduction in the threshold electrical field for electron field emission; conversion of the semiconducting material to a metal; an increase in the electrical conductivity; an increase in the electron density of state at the Fermi level; and an increase the electron field emission site density.

BACKGROUND OF THE INVENTION

In the description of the background of the present invention that follows reference is made to certain structures and methods, however, such references should not necessarily be construed as an admission that these structures and methods qualify as prior art under the applicable statutory provisions. Applicants reserve the right to demonstrate that any of the referenced subject matter does not constitute prior art with regard to the present invention.

The term "nano-structured" or "nanostructure" material is used by those familiar with the art to designate materials including nanoparticles such as $C_{60}$ fullerenes, fullerene-type concentric graphitic particles; nanowires/nanorods such as Si, Ge, $SiO_x$, $GeO_x$, or nanotubes composed of either single or multiple elements such as carbon, $B_xN_y$, $C_xB_yN_z$ $MoS_2$, and $WS_2$. One of the common features of the "nano-structured" or nanostructure" materials is their basic building blocks. A single nanoparticle or a carbon nanotube has a dimension that is less than 500 nm at least in one direction. These types of materials have been shown to exhibit certain properties that have raised interest in a variety of applications.

U.S. Pat. No. 6,280,697 entitled "Nanotube-Based High Energy Material and Method", the disclosure of which is incorporated herein by reference, in its entirety, discloses the fabrication of carbon-based nanotube materials and their use as a battery electrode material.

U.S. Pat. No. 6,630,772 entitled "Device Comprising Carbon Nanotube Field Emitter Structure and Process for Forming Device" the disclosure of which is incorporated herein by reference, in its entirety, discloses a carbon nanotube-based electron emitter structure.

Ser. No. 09/351,537 entitled "Device Comprising Thin Film Carbon Nanotube Electron Field Emitter Structure", the disclosure of which is incorporated herein by reference, in its entirety, discloses a carbon-nanotube field emitter structure having a high emitted current density.

U.S. Pat. No. 6,277,318 entitled "Method for Fabrication of Patterned Carbon Nanotube Films, the disclosure of which incorporated herein by reference, in its entirety, discloses a method of fabricating adherent, patterned carbon nanotube films onto a substrate.

U.S. Pat. No. 6,334,939 entitled "Nanostructure-Based High Energy Material and Method, the disclosure of which is incorporated herein by reference, in its entirety, discloses a nanostructure alloy with alkali metal as one of the components. Such materials are described as being useful in certain battery applications.

U.S. Pat. No. 6,553,096 entitled "X-Ray Generating Mechanism Using Electron Field Emission Cathode", the disclosure of which is incorporated herein by reference, in its entirety, discloses an X-ray generating device incorporating nanostructure-containing material.

Ser. No. 09/817,164 entitled "Coated Electrode With Enhanced Electron Emission And Ignition Characteristics" the disclosure of which is incorporated herein by reference, in its entirety, discloses an electrode including a first electrode material, an adhesion-promoting layer, and a carbon nanotube-containing material disposed on at least a portion of the adhesion promoting layer, as well as associated devices incorporating such an electrode.

As evidenced by the above, these materials have been shown to be excellent electron field emission materials. In this regard, such materials have been shown to possess low electron emission threshold applied field values, as well as high emitted electron current density capabilities, especially when compared with other conventional electron emission materials.

For example, it has been shown that the electronic work functions of carbon nanotube materials, which is one of the critical parameters that determines the electron emission threshold field, are in the range of 4.6–4.9 eV (electron Voltage). See, e.g.—"Work Functions and Valence Band States of Pristine and Cs-intercalated Single-walled Carbon Nanotube Bundles," Suzuki et al, Appl. Phys. Lett., Vol. 76, No. 26, pp. 407–409, Jun. 26, 2000.

It has also been shown that the electronic work functions of carbon nanotube materials can be reduced substantially when they are intercalated with alkali metals, such as cesium. See, e.g.—Ibid., and "Effects of Cs Deposition on the Field-emission Properties of Single-walled Carbon Nanotube Bundles," A. Wadhawan et al., Appl. Phys. Lett., 78 (No. 1), pp. 108–110, Jan. 1, 2001.

As illustrated in FIG. 1, the spectral intensity at the Fermi level of the pristine single walled carbon nanotubes is very small. On the other hand, a distinct Fermi edge is observed for the Cs-intercalated sample. From the spectral intensity at the Fermi level, we can conclude that the density of states at the Fermi level of the Cs-intercalated sample is roughly two orders larger than that of the pristine material. Further, as illustrated in FIG. 2, the results show that the work function of the single-walled carbon nanotube decreases with increasing Cs deposition time. (The spectra were measured at room temperature using a He lamp Hv=21.22 eV).

By reducing the electronic work functions of carbon nanotube materials, the magnitude of the applied electrical field necessary to induce electron emission can be significantly reduced. This relationship can be understood from the Fowler-Nordheim equation:

$$I=aV^2\exp(-b\phi^{3/2}/bV)$$

wherein I=emission current, V=applied voltage, φ=electron work function, and β=field enhancement factor, a and b=constants.

Thus, as evident from the above equation, a reduction in the work function value φ, has an exponential effect on the emission current I. Experimental evidence has verified the above-noted relationship.

Nanotubes, such as carbon nanotubes synthesized by the current techniques such as laser ablation, chemical vapor deposition, and arc-discharge methods typically have enclosed structures, with hollow cores that are enclosed by the graphene shells on the side and ends. Carbon nanotubes, especially single-walled carbon nanotubes have very low defect and vacancy density on the side walls. The perfect graphene shells can not be penetrated by foreign species. The interior space of the nanotubes is usually inaccessible for filling and/or intercalation. Although defects are commonly observed on the sidewalls of the multi-walled carbon nanotubes, only the space between the concentric graphene shells is partially accessible.

Previous techniques for intercalating the carbon nanotube materials have included techniques such as vapor phase reaction between the raw carbon nanotube materials and the material to be intercalated (e.g.—alkali metal), and electrochemical methods. Examination of carbon nanotube materials intercalated in this manner has revealed that the alkali metal atoms intercalate into space between the single-walled nanotubes inside the nanotube bundles or the space between the concentric graphene shells in multi-walled carbon nanotubes.

However, such intercalated carbon nanotube materials possess certain disadvantages.

First, since alkali metals are extremely air-sensitive, the interaction with carbon nanotube materials must take place in a vacuum environment. This makes these materials difficult to process, and difficult to incorporate into practical devices.

Second, alkali metals have a relatively high vapor pressure and can be easily evaporated at relatively low temperatures. Thus, alkali metal which is deposited on carbon nanotube materials is very unstable during emission and can degrade easily in a short period of time, due at least in part to evaporation of the intercalated metals from the carbon nanotubes.

Third, carbon nanotubes are in the form of a closed cage-like structure, which typically possesses relatively few defects. This is especially true for single-walled carbon nanotubes. Thus, there is a tendency for the intercalated alkali metal atoms to be deposited within the bundles of nanotubes rather than inside the closed cage-like nanotubes themselves. This can be undesirable because the interior space of the nanotubes represents a much larger volume than the interstitial sites within carbon nanotube bundles. This limits the amount of metals which can be intercalated into the carbon nanotube materials.

Thus, there is a need in the art to address the above-mentioned disadvantages associated with methods for reducing the electronic work function of nanotube and nanoparticle materials, such as carbon nanotubes, particularly with regard to the technique for intercalating electron donors such as alkali metals, or even electron acceptors.

SUMMARY OF THE INVENTION

The present invention addresses the above-mentioned disadvantages associated with the state of the art, and others.

For example, the present invention provides a means for forming enclosed structures comprising alkali metals or other foreign species which are sealed within the nanotubes or nanoparticles themselves. These enclosed structures form "capsules" which are then stable in air and other environments, such as solvents. Since the alkali metal or foreign species is enclosed within these capsules, it is no longer as sensitive to the environment as would be the case if the material was exposed. Thus, the above-mentioned capsules can be further processed under ambient conditions. The intercalated alkali metals or other foreign species which are located within the capsules cannot be evaporated easily. Moreover, the intercalated alkali metal or foreign species within the capsules is less chemically reactive, i.e.—is relatively chemically inert. Because the interior space of the capsules are larger than the interstitial sites between adjacent structures, such as carbon nanotube bundles, more alkali metals or other foreign species may be stored. Due to charge transfer from the intercalated alkali metals to the surrounding strucutures, the resulting materials should have lower electronic work function values and higher densities of states at the Fermi electron level. In addition, because of the above-mentioned charge transfer phenomena, the capsules, which typically contain both semiconducting and metallic material, become all metallic in nature after the above-described intercalation performed according to the present invention. This charge transfer effect acts to further improve electron emissions properties.

According to one aspect, the present invention provides a method of manufacture comprising: (a) producing raw nanostructure or nanotube-containing material comprising closed structures; (b) purifying the raw material; (c) processing the purified material thereby forming openings in the closed structures; (d) introducing a foreign species comprising electron donors or electron acceptors into at least some of the openings; and (e) closing the openings, thereby forming capsules filled with the foreign species.

According to a further aspect, the present invention provides a method of reducing electronic work function, reducing threshold field emission values, converting semiconducting behavior to metallic behavior, increasing the electron density state at the fermi level, and increasing electron emission site density, of carbon nanotube-containing material, the method comprising: (a) forming openings in the carbon nanotube-containing material, (b) introducing a foreign species comprising an alkali metal into at least some of the openings, and (c) closing the openings, thereby forming carbon nanotube capsules filled with the foreign species.

According to another aspect, the present invention provides a method of manufacture comprising: (a) producing vertically oriented carbon nanotubes on a support surface;(b) applying an insulating layer;(c) opening tops of the nanotubes; (d) introducing a foreign species into the open tops and into interior spaces of the nanotubes;(e) closing the open tops of the nanotubes; and (f) activating the filled nanotubes.

The present invention also provides an electron field-emitting device comprising capsules formed by any of the methods described herein. The device can include, for example, an x-ray tube, a gas discharge device, a lighting device, a microwave amplifier, an ion gun, or an electron beam lithography device.

According to yet a further aspect, the present invention provides an article of manufacture comprising capsules formed by the any of the methods described herein. The article having an electron emission turn-on field to obtain an electron emission current density of 0.01 mA/cm$^2$ of less than 2V/$\mu$m.

BRIEF DESCRIPTION OF THE DRAWING FIGURES

DETAILED DESCRIPTION OF THE INVENTION

Figure 1:
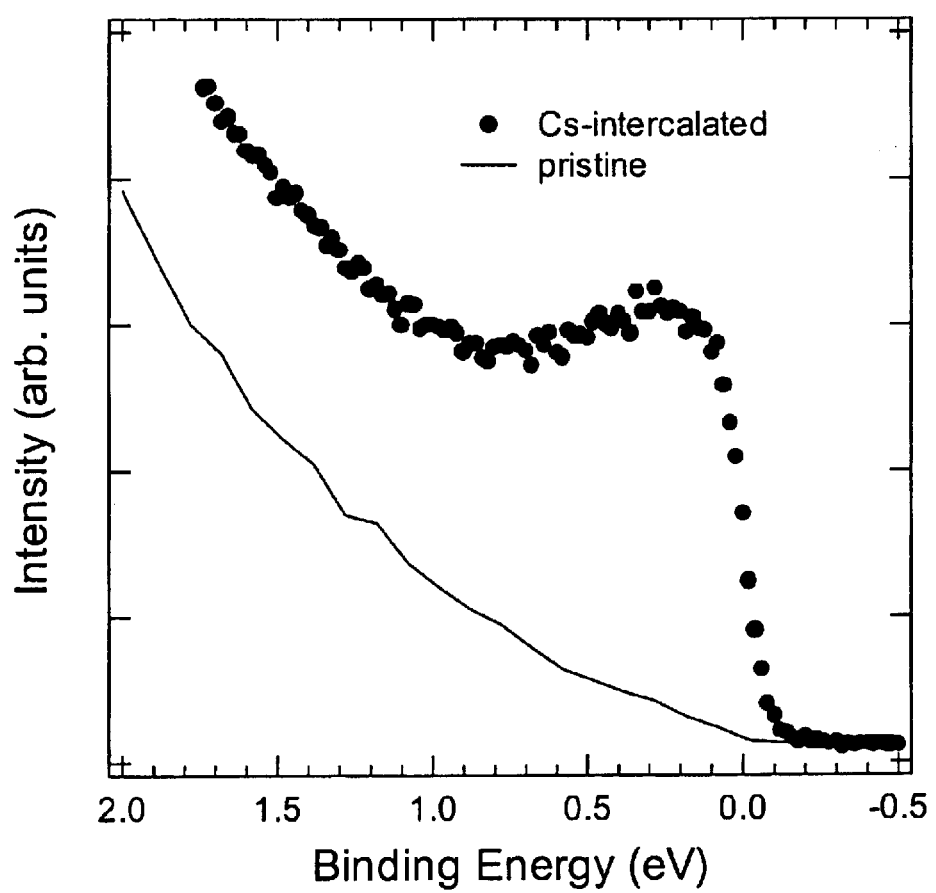
FIG. 1 is a photoemission spectra in the vicinity of the Fermi level of the pristine and Cs-intercalated single-walled carbon nanotubes.
Figure 2:
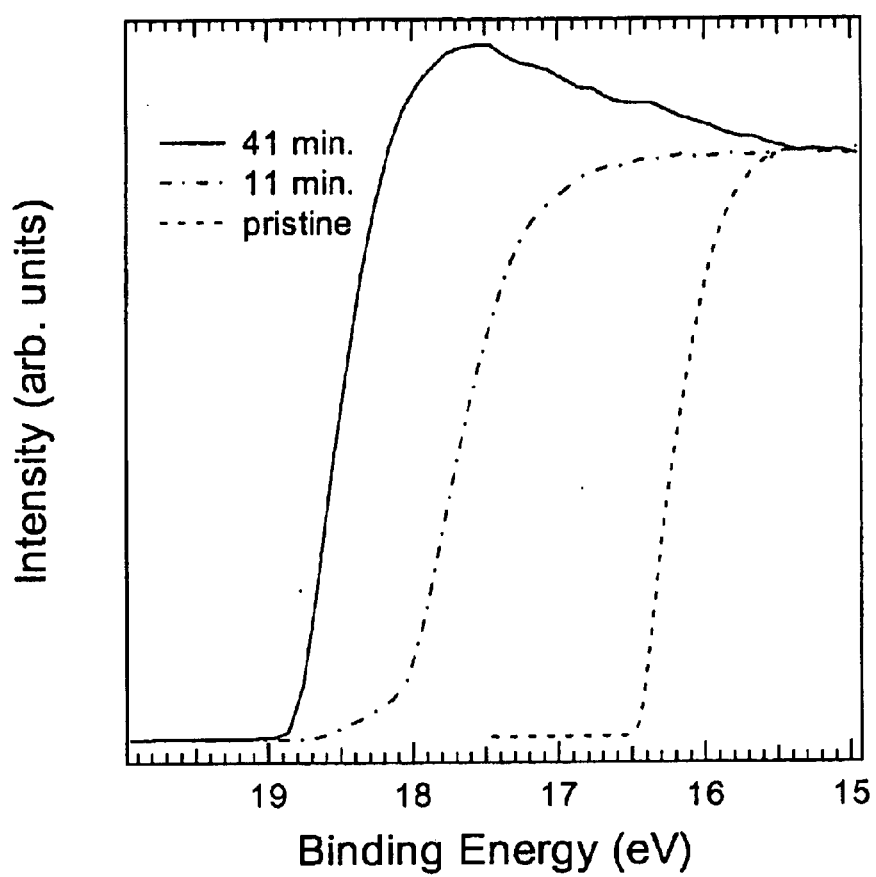
FIG. 2 shows the photoemission spectra around the secondary electron threshold regions of the pristine and the Cs-intercalated single-walled carbon nanotube bundles for various Cs deposition times.
Figure 3:
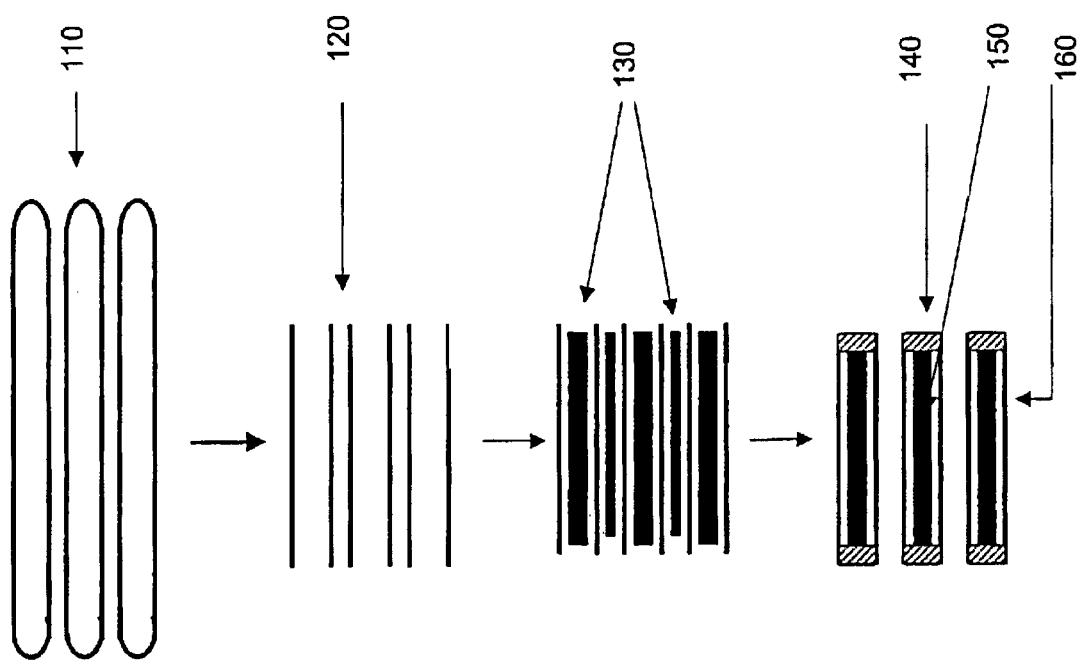
FIG. 3 is a schematic representation of a method performed consistent with the principles of the present invention.

A method performed consistent with the principles of the present invention, and according to a preferred embodiment, is schematically illustrated in FIG. 3.

The process begin with raw nanoparticle or nanotube containing material, such as carbon nanotube-containing material 110. This raw nanotube material 110 can comprise at least one of single-walled carbon nanotubes and multi-walled carbon nanotubes. According to a preferred embodiment, the raw carbon nanotube-containing material 110 comprises single-walled carbon nanotubes. The raw carbon-containing material 110 can be fabricated according to a number of different techniques familiar to those in the art. For example, the raw carbon nanotube-containing material 110 can be fabricated by laser ablation techniques (e.g.—see U.S. Pat. No. 6,280,697), chemical vapor deposition techniques (see, e.g.—C. Bower al., "Plasma Induced Conformal Alignment of Carbon Nanotubes on Curvatured Surfaces," Appl Phys Lett. Vol. 77, No. 6, pgs. 830–32 (2000)), the content of which is incorporated herein by reference in its entirety, or arc-discharge techniques (see, e.g.—C. Journet et al., Nature, Vol. 388, p. 756 (1997)). e.g.—C. Journet et al., Nature, Vol. 388, p. 756 (1997)).

It is also contemplated by the present invention that raw materials be in the form of nanotube structures with a composition of $B_xC_yN_z$ (B=boron, C=carbon, and N=nitrogen), or nanotube or concentric fullerene structures with a composition $MS_2$ (M=tungsten, molybdenum, or vanadium oxide) can be utilized. These raw materials can be formed by any suitable technique, such as the above-mentioned arc-discharge technique.

Next, the raw carbon nanotube-containing material 110 is subjected to purification. A number of techniques for purifying the raw materials are envisioned. According to one preferred embodiment, the raw carbon nanotube-containing material 110 is placed in a suitable liquid medium, such as an acidic medium, an organic solvent, or an alcohol, preferably methanol. The nanotubes are kept in suspension within the liquid medium for several hours using high powered ultrasonic horn, while the suspension is passed through a microporous membrane. In another embodiment, the raw material can be purified by reflux in a suitable solvent, such as a combination of peroxide ($H_2O_2$) and water, with an $H_2O_2$ concentration 1–40% by volume, preferably about 20% by volume $H_2O_2$ with subsequent rinsing in $CS_2$ and then in methanol, followed by filtration. According to an exemplary technique, approximately 10–100 ml of peroxide is introduced into the medium for every 1–10 mg of nanotubes in the medium, and the reflux reaction is carried out at a temperature of 20–100° C. (see, e.g.—U.S. Pat. No. 6.553.096.

In another embodiment, the raw materials can be purified by oxidation in air or an oxygen environment at a temperature of 200–700° C. The impurities in the raw materials are oxidized at a faster rate than the nanotubes.

The raw material is then subjected to further processing to shorten and open the ends of the nanotubes to form cut nanotubes 120. A number of suitable techniques for forming cut nanotubes 120 are envisioned. According to a preferred embodiment, cut nanotubes 120 are formed by a mechanical method. For instance, cut carbon nanotubes 120 can be formed by ball milling the purified carbon nanotube material. According to this technique, a sample of the purified carbon nanotube material is placed inside a suitable container, along with appropriate milling media. The container is then shut and placed within a suitable holder of a ball-milling machine. According to the present invention, the time that the sample is milled can vary. An appropriate amount of milling time can be readily determined by inspection of the milled nanotubes.

According to another embodiment, the cut carbon nanotubes 120 can be formed by a chemical process. For example, the purified carbon nanotube material can be subjected to oxidation in a strong acid. For example, purified carbon nanotube material can be placed in an appropriate container in a solution of acid comprising $H_2SO_4$ and $HNO_3$. The carbon nanotubes in solution are then subjected to sonication for an appropriate length of time. After sonication, the processed nanotubes are collected from the acid solution by either filtration or centrifuging after repeated dilution with de-ionized water.

According to an alternative embodiment, the nanotubes are first processed by ion bombardment to create defects on the sidewalls of the nanotubes before being processed to form openings in the ends of the nanotubes. The defect density can be controlled by the processing time, intensity of the ion beam, and nature of the ion used. In the example of carbon nanotubes, ion bombardment causes breakage of the carbon bonds upon impact. After ion bombardment, the nanotubes are then further processed to form openings in the ends thereof, including milling or sonication in either alcohol or acid, as described above.

Figure 5:
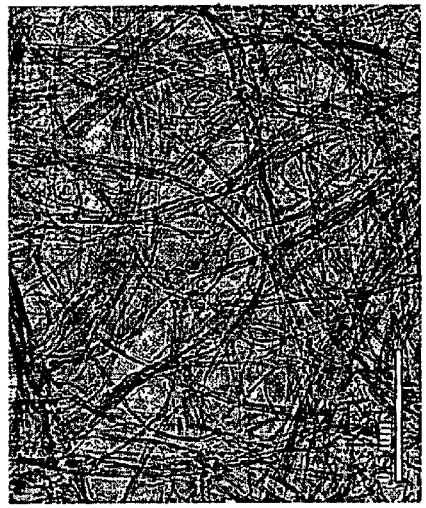
FIG. 5 is a microscopic image of pure single-walled carbon nanotubes.
Figure 7:
FIG. 7 is a microscopic image of single-walled carbon nanotubes processed for 24 hours.
Figure 6:
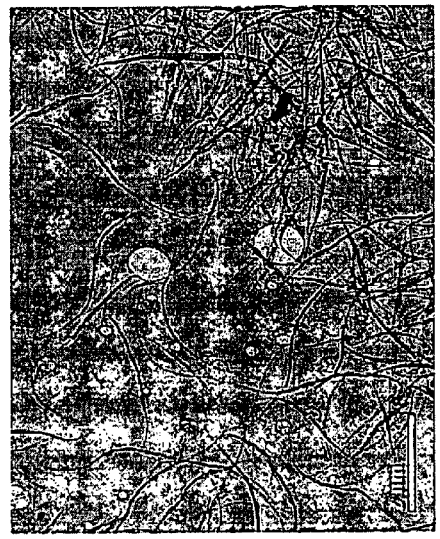
FIG. 6 is a microscopic image of single-walled carbon nanotubes after processing for ten hours.

FIG. 5 is a microscopic image of purified single-walled carbon nanotubes. The nanotubes were made by the laser ablation method and were purified by reflux in $H_2O_2$ followed by filtration. FIG. 6 is a microscopic image of single-walled carbon nanotubes after being sonicated in 3:1 volume ratio of $H_2SO_4$ and $HNO_3$ for 10 hours. FIG. 7 is a microscopic image of purified single-walled carbon nanotubes after being sonicated in 3:1 volume ratio of $H_2SO_4$ and $HNO_3$ for 24 hours.

The above-described cut nanotubes 120 are first dried in vacuum at 100° C.–600° C. temperature and are then intercalated with either an electron donor or an electron acceptor. According to a preferred embodiment, the cut carbon nanotubes 120 are intercalated with an alkali metal. According to a further preferred embodiment, the cut carbon nanotubes 120 are intercalated with: Li, Na, K, Rb, Cs, Mg, Ca, Sr, Ba, Sc, Y, Fe, Co, Ni, Cu, or alloys thereof; a Lewis acid; halogen mixtures; metal chlorides; metal bromides; metal fluorides; metal oxyhalides; acidic oxides; and strong acids. According a further embodiment, the Lewis acid comprises halogen $Br_2$, the acidic oxide comprises $N_2O_5$ or $SO_3$, and the strong acid comprises $HNO_3$ or $H_2SO_4$.

A number of suitable techniques are envisioned for introducing the intercalated species 130. For example, the intercalated species 130 may be introduced by a vapor phase transport method. Generally, this technique involves exposing the cut carbon nanotubes 120 to a vaporized intercalated species 130. For example, the above cut carbon nanotubes can be placed at one end of a reaction container such as a glass tube. The species to be intercalated such as alkali metal can be placed at the opposite end of the container. When the chemical is sensitive to air and/or water, the loading can be carried out in an inert gas-filled box. The reaction container is then sealed either under inert gas environment or under vacuum. It is then heated in a furnace at a temperature where the chemical has sufficiently high vapor pressure. In the case of alkali metal, this is typically 200–500° C. The vapor from the chemical will react with the nanotubes.

Alternatively, the intercalated species, or compounds or alloys containing the intercalated species, 130 may be introduced by reaction between the cut nanotubes 120. For example, in the case of alkali metal, compounds such as AH (A=alkali metal, H=hydrogen), $ABH_4$ (B=boron), $AN_3$ (alkali metal azide), AF (F=fluorine) and ABr (Br=bromine) can be used as the alkali metal source. They can be mixed with the nanotubes then sealed in a reaction container. The container is then heated at a temperature above the decomposition temperature of the compound.

According to another embodiment, the intercalated species may be introduced by solution synthesis. Generally, this technique involves first dissolution or dispersion of the nanotubes in a solvent, which can be, for example, THF or liquid ammonia. A foreign species, such as alkali metal, are also dissolved in the solvent. After stirring for sometime, the solution/suspension is heated to remove the solvent. The intercalated nanotubes can be harvested after removal of the solvent.

According to yet another embodiment, the intercalated species 130 may be introduced by an electrochemical reaction. Generally, this technique involves the discharge of ions of the intercalated species 130 from an electrode formed from the same material thereof which then travels from the electrode from which it is discharged and into the cut nanotube material 120. Upon reaching the cut nanotubes 120, a chemical reaction takes place, even at relatively low temperatures (see, e.g.,—U.S. Pat. No. 6,334,939).

According to yet another embodiment, intercalated species can be evaporated onto the nanotube surfaces. The exposed nanotubes are then heated to facilitate the diffusion of the species into the nanotubes. For air-sensitive materials, the evaporation and heating are carried out either in vacuum or controlled environment. For example, the alkali metals can be evaporated onto the nanotubes either by using an alkali metal dispenser or by direct heating a reservoir containing the alkali metal in a sealed container under vacuum.

The electronic work function, as well as the electronic density of state at the Fermi Level, and the electrical conductivity of the material can be varied by controlling the amount of foreign species introduced. For example, the work function has been varied 0–3 eV by altering the amount of foreign species introduced.

As illustrated in FIG. 3, the intercalated species 130 are introduced into the cut nanotubes 120 as well as in between adjacent nanotubes.

The intercalated nanotubes are then subjected to further processing in order to close the opened ends thereof. A number of suitable techniques for achieving this objective are possible. According to a preferred embodiment, the intercalated carbon nanotubes are chemically processed. For example, the intercalated nanotubes are dispersed into a suitable solvent such as alcohol. The solvent either reacts or dissolves the intercalated species 130 which is located between adjacent nanotubes. In addition, the solvent also will react with the intercalated species which are exposed to the solvent at the opened ends of the nanotubes. This reaction results in a formation of passivation layers 140 which act to close the open ends of the nanotubes. Passivation layers 140 can comprise, for example, an oxide or hydroxide of the intercalated species 130.

In an alternative embodiment, the passivation layers 140 can be formed by exposing the filled material to oxygen or an oxygen-containing gas.

The filled nanotubes or nanostructure material may also be further processed to remove reaction products, resulting from one or more of the above-mentioned processing steps.

After the nanostructure or nanotube material has reacted with the intercalated species and compound is produced that, in the embodiment where the material comprises carbon nanostructures or nanotubes, $A_xC$, where x is greater than 0 to 1, and A is the foreign species which comprises at least one of: Li, Na, K, Rb, Cs, Mg, Ca, Sr, Ba, Sc, Y, Fe, Co, Ni, Cu, or alloys thereof; a Lewis acid; halogen mixtures; metal chlorides; metal bromides; metal fluorides; metal oxyhalides; acidic oxides; and strong acids. The Lewis acid can comprise halogen $Br_2$, the acidic oxide can comprise $N_2O_5$ or $SO_3$, and the strong acid comprise $HNO_3$ or $H_3O_4$.

After the formation of passivation layers 140, the resulting structure comprises the intercalated species 130 which is enclosed and contained by the passivation layers 140 as well as the nanotube walls 150, thereby resulting in enclosed stable structures or capsules 160. These capsules 160 are stable in air and solvents. Therefore, the capsules 160 are readily and easily subjected to further processing such as deposition onto substrates by techniques such as screen printing, electrophoretic deposition, spin coating, casting, spraying and sputtering. Moreover, since the capsules are relatively stable, strict controls of the environments in which such capsules 160 can be processed is not necessary. The capsules 160 exhibit enhanced electron emission stability, because the volatility of the encapsulated intercalated species 130 is reduced by the enclosed structure. The capsules 160 are also relatively chemically inert.

A further advantage of the capsules 160 produced according to the method of the present invention is a reduction in work function relative to raw nanotube materials alone. Moreover, in a case where the intercalated species 130 constitutes an electron donor, such as an alkali metal, or an electron acceptor, a charge of the intercalated alkali metal is transferred to the surrounding nanotube structure, thereby a further improvement in the emission properties is to be expected.

As an optional, additional processing step, the passivation layers 140 may be removed by any suitable technique, such as passing hydrogen plasma over them.

An alternative method according to the present invention for forming enclosed capsules of the type described above is illustrated schematically in FIG. 4. The method illustrated in FIG. 4 utilizes many of the same techniques and principles described above. Therefore the following description emphasizes those aspects of the alternative method which differ from the subject matter previously described.

Figure 4:
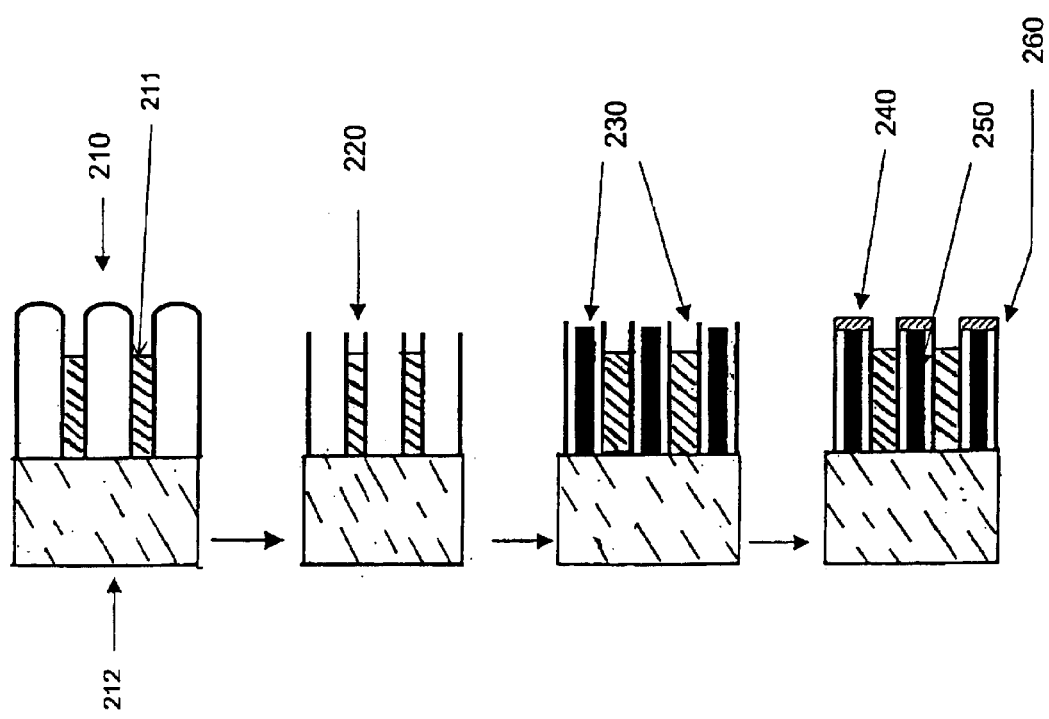
FIG. 4 is a schematic representation of an alternative method performed consistent with the principles of the present invention.

The process begins with the formation of nanotubes, such as single-walled or multiwalled carbon nanotubes 210, which are directionally grown on a surface of a support 212. The nanotubes can be grown by the above-described chemical vapor deposition technique. In one embodiment, plasma enhanced chemical disposition method is used. In this process, suitable catalyst, such as Ni, Co, Fe, Rh, Pd, alloys thereof, or chemicals containing at least one of these elements. Preferably, the nanotubes 210 are substantially aligned in the vertical direction, as illustrated in FIG. 4. The support 212 can be formed from any suitable material, such as a Si wafer. In one preferred embodiment the supporting material containing the catalyst is heated in vacuum for sometime until the catalyst forms a smaller island structure on the surface of the supporting material. The size of the islands is preferably uniform, and smaller than 100 nm in diameter. Carbon nanotubes are grown from these catalysts by: putting the support in a reaction chamber that is heated to 400–1200° C.; igniting a plasma; and passing a hydrocarbon gas into the reaction chamber.

Under the influence of the plasma, vertically aligned (i.e. perpendicular to the support surface) carbon nanotubes can be fabricated.

A suitable insulating layer 211 is provided. As illustrated in FIG. 4, the insulating layer 214 occupies at least the spaces between vertically aligned nanotubes 210, and in the illustrated embodiment, also covers the ends as well. According to a preferred embodiment, insulting layer 211 is a polymer, such as PMMA, polyimides, or epoxies.

The nanotubes 210 are then processed to open their exposed ends or tops thereby forming cut or open nanotubes 220. According to a preferred embodiment, the open nanotubes 220 can be formed by chemical etching, hydrogen plasma etching, or oxygen plasma etching, as described above, which acts to remove the insulating layer 211 covering the ends, as well as open the ends of the nanotubes. According to the illustrated preferred embodiment, the portion of the insulating layer 211 in between the nanotubes remains.

Next, any of the previously disclosed foreign species 230 may be introduced into the openings and interior spaces of open nanotubes 220. The foreign species 230 can be introduced by any of the previously described techniques. According to a preferred embodiment, the foreign species 230 is introduced by evaporation or electrochemical reaction, as described above.

The filled nanotubes are then further processed to close the open ends thereof. According to a preferred embodiment, passivation layers 240 are formed by any of the above-described techniques.

For certain applications, it is desirable to remove the oxide passivation layer before use. In this case, the sample is first transferred to a vacuum chamber. The passivation layers 240 are then removed by passing a hydrogen plasma over them.

The methods of the present invention provides an improved means for forming nanotube structures comprising intercalated alkali metals or other foreign species which are sealed within the nanotubes themselves. These enclosed structures are then stable in air and other environments, such as solvents. Thus, since the alkali metal or foreign species is enclosed within the capsule, it is no longer as sensitive to the environment as would be the case if the material was exposed. Thus, the above-mentioned capsules can be further processed under ambient conditions. The intercalated alkali metals or other foreign species which are located within the nanotubes cannot be evaporated easily. Moreover, the intercalated alkali metal or foreign species within the nanotubes is less chemically reactive, i.e.—is relatively chemically inert. Because the interior space of the nanotubes are larger than the interstitial sites between nanotube bundles, more alkali metals or other foreign species may be stored. Due to charge transfer from the intercalated alkali metals to the surrounding nanotubes, the resulting materials should have lower electronic work function values and higher densities of states at the Fermi electron level. In addition, because of the above-mentioned charge transfer phenomena, the nanotubes, which would normally be semiconducting in nature, become metallic in nature after the above-described intercalation performed according to the present invention. This charge transfer effect acts to further improve the electron emissions properties.

The methods of the present invention are useful in producing nanotube materials which have properties that make them beneficial for use in a number of different applications. Generally, the method of the present invention is especially beneficial in providing nanotube material for incorporation into electron field emission cathodes for devices such as x-ray generating devices, gas discharge tubes, lighting devices, microwave power amplifiers, ion guns, electron beam lithography devices, high energy accelerators, free electron lasers, electron microscopes and microprobes, and flat panel displays.

Articles incorporating capsules formed according to the methods of the present invention exhibit excellent properties. For instance, an article of manufacture comprising capsules formed by the methods of the present invention have an electron emission turn-on field to obtain an electron emission current density of 0.01 mA/cm$^2$ of less than 2V/$\mu$m, preferably less than 1V/$\mu$m, and more preferably less than 0.5 V/$\mu$m. Further, an article comprising capsules formed by the methods of the present invention is capable of sustained electron emission at a current density over 1 mA/cm$^2$, preferably over 10 mA/cm$^2$, and more preferably over 100 m/cm$^2$.

While the present invention has been described by reference to the above-mentioned embodiments, certain modifications and variations will be evident to those of ordinary skill in the art. Therefore, the present invention is to limited only by the scope and spirit of the appended claims.

What is claimed is:

1. A method of manufacturing a material comprising:
    (a) producing raw nanostructure or nanotube-containing material comprising closed structures;
    (b) purifying the raw material;
    (c) processing the purified material thereby forming openings in the closed structures;
    (d) introducing a foreign species comprising electron donors or electron acceptors into at least some of the openings;
    (e) varying at least one of electronic work function, electronic density of state at the Fermi Level, and electrical conductivity of the material by controlling the amount of foreign species introduced at step (d); and
    (f) closing the openings by forming passivation layers, the passivation layers being formed by exposing the nanostructure or nanotube-containing material containing the foreign species to oxygen or an oxygen-containing gas, thereby forming capsules filled with the foreign species.

2. The method of claim 1, wherein step (a) comprises producing single-walled carbon nanotube-containing material.

3. The method of claim 1, wherein step (a) comprises producing multi-walled carbon nanotube-containing material.

4. The method of claim 1, wherein step (a) comprises directionally growing carbon nanotubes on a support surface.

5. The method of claim 1, wherein step (a) comprises producing carbon nanoparticles with concentric fullerene-type structures.

6. The method of claim 1, wherein step (a) comprises producing nanotube structures with composition of $B_xC_yN_z$, where B=boron, C=carbon, and N=nitrogen.

7. The method of claim 1, wherein step (a) comprises producing nanotube structures with composition of $MS_2$, where M=tungsten, molybdenum or vanadium oxide.

8. The method of claim 1, wherein step (a) comprises producing concentric fullerene structures with composition of $MS_2$, where M=tungsten, molybdenum or vanadium oxide.

9. The method of claim 1, wherein step (b) comprises subjecting the raw material to ultrasonic filtration.

10. The method of claim 1, wherein step (b) comprises subjecting the raw material to a reflux procedure in an acidic medium.

11. The method of claim 1, wherein step (b) comprises subjecting the raw material first to a reflux procedure in an acidic medium, then to filtration.

12. The method of claim 1, wherein step (b) comprises subjecting the raw material to oxidation in air or oxygen environment at a temperature of 300–600° C.

13. The method of claim 1, wherein step (c) comprises ultrasonication of the purified material in an acidic medium.

14. The method of claim 1, wherein step (c) comprises milling the purified material.

15. The method of claim 1, wherein step (c) comprises bombarding the purified material with ions, then subjecting the material to ultrasonication in an acidic medium.

16. The method of claim 1, wherein step (c) comprises subjecting the purified material to plasma etching.

17. The method of claim 16, wherein the plasma etching comprises etching with hydrogen or oxygen plasma.

18. The method of claim 1, wherein the foreign species of step (d) comprises at least one alkali metal or an alloy of an alkali metal.

19. The method of claim 1, wherein the foreign species of step (d) comprises at least one of Mg, Ca, Sr, Ba, or an alloy thereof.

20. The method of claim 1, wherein the foreign species of step (d) comprises at least one of Sc, Y, Fe, Co, Ni, Cu, or an alloy thereof.

21. The method of claim 1, wherein the foreign species of step (d) comprises at least one of a Lewis acid, halogen mixture, metal chloride, metal bromide, metal fluoride, metal oxyhalide, an acidic oxide, and a strong acid.

22. The method of claim 1, wherein the foreign species of step (d) comprises cesium.

23. The method of claim 1, wherein step (d) comprises vapor phase transportation of the foreign species.

24. The method of claim 1, wherein step (d) comprises evaporation of the foreign species from a source.

25. The method of claim 1, wherein step (d) comprises solid state reaction of chemicals containing the foreign species and the processed purified material.

26. The method of claim 1, wherein step (d) comprises electrochemical reaction between the foreign species and the processed purified material.

27. The method of claim 1, wherein the passivation layers are formed by dispersing the filled capsules in a solvent.

28. The method of claim 1, further comprising:
(f) removing reaction products from the outer surfaces of the filled capsules.

29. The method of claim 1, further comprising:
(f) forming a field-emitting cathode by screen printing, electrophoretic deposition, spin coating, casting, spraying or sputtering of the capsules.

30. The method of claim 1, wherein the foreign species comprises at least one of: Li, Na, K, Rb, Cs, Mg, Ca, Sr, Ba, Sc, Y, Fe, Co, Ni, Cu, or alloys thereof; a Lewis acid; halogen mixtures; metal chlorides; metal bromides; metal fluorides; metal oxyhalides; acidic oxides; and at least on of $HNO_3$ and $H_2SO_4$.

31. The method of claim 30, wherein the foreign species comprises at least one of: Li, Na, K, Rb, Cs, Mg, Ca, Sr. Ba, Sc, Y, Fe, Co, Ni, Cu, or alloys thereof: a Lewis acid; halogen mixtures; metal chlorides; metal bromides; metal fluorides; metal oxyhalides; acidic oxides; and at least one of $HNO_3$ and $H_2SO_4$.

32. The method of claim 30, wherein the Lewis acid comprises halogen $Br_2$, the acidic oxide comprises $N_2O_5$ or $SO_3$.

33. The method of claim 1, wherein the materials produced after step (d) have an electronic workfunction of less than 5.5 eV.

34. The method of claim 1, wherein the materials produced after step (d) have an electronic workfunction of less than 4 eV.

35. The method of claim 1, wherein the materials produced after step (d) have an electronic workfunction of less than 3 eV.

36. The method of claim 1, wherein the materials produced after step (e) have an electronic workfunction of less than 4 eV.

37. The method of claim 1, wherein the materials produced after step (e) have an electronic workfunction of less than 3 eV.

38. The method of claim 1, further comprising varying the electronic workfunction of the materials produced after step (d) by 0 to 3 eV by controlling the amount of foreign species intercalated.

39. The method of claim 1, further comprising varying the electronic workfunction of the materials produced after step (e) by 0 to 3 eV by controlling the amount of foreign species intercalated.

40. The method of claim 1, wherein the materials produced after step (d) have a metallic behavior.

41. The method of claim 1, wherein the materials produced after step (e) have a metallic behavior.

42. The method of claim 1, wherein the material has an electron emission turn-on field of less than 2 V/$\mu$m to obtain an electron emission current density of 0.01 mA/cm$^2$.

43. The method of claim 42, wherein the material has an electron emission turn-on field of less than 1 V/$\mu$m.

44. The method of claim 42, wherein the material has an electron emission turn-on field of less than 05 V/$\mu$m.

45. A method of manufacture comprising:
(a) producing vertically oriented carbon nanotubes on a support surface;
(b) applying an insulating layer;
(c) opening tops of the nanotubes;
(d) introducing a foreign species into the open tops and into interior spaces of the nanotubes;
(e) closing the open tops of the nanotubes; and
(f) activating the filled nanotubes.

46. The method of claim 45, wherein step (a) comprises producing the nanotubes by chemical vapor deposition.

47. The method of claim 45, wherein the insulating layer in step (b) comprises a polymer.

48. The method of claim 45, wherein step (c) comprises etching.

49. The method of claim 48, wherein step (c) comprises chemical etching, hydrogen plasma etching or oxygen plasma etching.

50. The method of claim 49, wherein step (c) includes removal of at least a portion of the insulating layer.

51. The method of claim 45, wherein step (d) comprises evaporation of the foreign species.

52. The method of claim 45, wherein step (d) comprises electrochemical reaction of the foreign species.

53. The method of claim 45, wherein step (e) comprises forming passivation layers, thereby closing the open ends.

54. The method of claim 45, wherein step (f) comprises exposing the filled nanotubes to hydrogen plasma.

* * * * *